United States Patent
Tani

(10) Patent No.: US 9,398,724 B2
(45) Date of Patent: Jul. 19, 2016

(54) CONTROL DEVICE AND MOTOR UNIT INCLUDING THE CONTROL DEVICE

(71) Applicant: JTEKT CORPORATION, Osaka-shi, Osaka (JP)

(72) Inventor: Naoki Tani, Kashiwara (JP)

(73) Assignee: JTEKT CORPORATION, Osaka (JP)

( * ) Notice: Subject to any disclaimer, the term of this patent is extended or adjusted under 35 U.S.C. 154(b) by 640 days.

(21) Appl. No.: 13/924,918

(22) Filed: Jun. 24, 2013

(65) Prior Publication Data

US 2014/0009012 A1    Jan. 9, 2014

(30) Foreign Application Priority Data

Jul. 3, 2012    (JP) .................................. 2012-149814

(51) Int. Cl.
| | |
|---|---|
| H02K 11/00 | (2016.01) |
| H05K 7/20 | (2006.01) |
| H02K 9/00 | (2006.01) |
| H02K 7/116 | (2006.01) |

(52) U.S. Cl.
CPC ............... *H05K 7/2039* (2013.01); *H02K 9/00* (2013.01); *H02K 11/21* (2016.01); *H02K 11/225* (2016.01); *H02K 11/33* (2016.01); *H02K 7/116* (2013.01)

(58) Field of Classification Search
CPC .......... H02K 11/0068; H02K 11/0073; H02K 11/33; H02K 2211/03; H02K 2203/03; H05K 7/2039
USPC ........... 361/704, 709; 310/68 B, 68 D, 64, 71
See application file for complete search history.

(56) References Cited

U.S. PATENT DOCUMENTS

| | | | | |
|---|---|---|---|---|
| 2006/0158049 | A1* | 7/2006 | Suzuki ................... | H02K 11/33 310/52 |
| 2007/0063603 | A1* | 3/2007 | Levine .................. | D06F 37/206 310/85 |
| 2011/0242764 | A1* | 10/2011 | Hill .......................... | G06F 1/203 361/705 |
| 2012/0039729 | A1* | 2/2012 | Horng ................. | F04D 25/0606 417/410.1 |

FOREIGN PATENT DOCUMENTS

| | | |
|---|---|---|
| EP | 1 587 140 A2 | 10/2005 |
| JP | 2002-319781 A | 10/2002 |

(Continued)

OTHER PUBLICATIONS

Dec. 4, 2015 Extended Search Report issued in European Patent Application No. 13174096.1.

(Continued)

*Primary Examiner* — Thanh Lam
(74) *Attorney, Agent, or Firm* — Oliff PLC

(57) ABSTRACT

A control device of a motor unit includes a housing, and a circuit board that is housed in the housing. The circuit board includes a first substrate portion which is fixed to a side wall and in which heat dissipation components are fitted onto a first main surface, a second substrate portion in which a second main surface faces the first main surface of the first substrate portion, and heating elements are fitted onto the second main surface, and a first connecting portion that connects an end portion of the first substrate portion with an end portion of the second substrate portion. The heating elements and the heat dissipation components face each other.

6 Claims, 7 Drawing Sheets

(56) References Cited

FOREIGN PATENT DOCUMENTS

| JP | A-2007-027280 | 2/2007 |
| JP | 2011-228453 A | 11/2011 |

OTHER PUBLICATIONS

Mar. 29, 2016 Office Action issued in Japanese Application No. 2012-149814.

* cited by examiner

CONTROL DEVICE AND MOTOR UNIT INCLUDING THE CONTROL DEVICE

INCORPORATION BY REFERENCE/RELATED APPLICATION

This application claims priority to Japanese Patent Application No. 2012-149814 filed on Jul. 3, 2012 the disclosure of which, including the specification, drawings and abstract, is incorporated herein by reference in its entirety.

BACKGROUND OF THE INVENTION

1. Field of the Invention

The invention relates to a control device that has a circuit board having a heating element, and a motor unit having the control device.

2. Discussion of Background

With reference to FIG. 10, a structure of a conventional control device 300 described in Japanese Patent Application Publication No. 2007-27280 (JP 2007-27280 A) will be explained. The control device 300 includes a circuit board 310 and a housing 320. The circuit board 310 has a first substrate portion 311, a second substrate portion 312, and a connecting portion 313.

The first substrate portion 311 is formed of a rigid substrate. The first substrate portion 311 has heating elements 311A. The second substrate portion 312 is formed of a rigid substrate. The connecting portion 313 is formed of a flexible substrate. The housing 320 has a supporting bottom wall 321 that supports the first substrate portion 311, and struts 322 that support the second substrate portion 312.

In the control device 300, the heating elements 311A are arranged in a space that is sandwiched between the first substrate portion 311 and the second substrate portion 312. Therefore, it is considered that heat of the heating elements 311A is not dissipated easily. However, in JP 2007-27280 A, there is no particular reference to heat dissipation of the heating elements 311A. Hence, the control device 300 has an issue for improvement in heat dissipation of the heating elements 311A.

SUMMARY OF THE INVENTION

The invention provides a control device having a structure in which heat dissipation performance of a heating element is high, and a motor unit having the control device.

According to a feature of an example of the invention, a control device including a circuit board and a housing is provided, wherein the housing has a supporting wall portion that supports the circuit board, and the circuit board includes a first substrate portion that is arranged on the supporting wall portion, has a first main surface, and has one of a heating element and a heat dissipation component, a second substrate portion that has a second main surface facing the first main surface of the first substrate portion, and has the other one of the heating element and the heat dissipation component, the heat dissipation component and the heating element facing each other, and a connecting portion that connects an end portion of the first substrate portion with an end portion of the second substrate portion.

BRIEF DESCRIPTION OF THE DRAWINGS

The foregoing and further objects, features and advantages of the invention will become apparent from the following description of example embodiments with reference to the accompanying drawings, wherein like numerals are used to represent like elements and wherein.

DETAILED DESCRIPTION OF EMBODIMENTS

Hereinafter, embodiments of the invention will be described with reference to the accompanying drawings.

Figure 1:
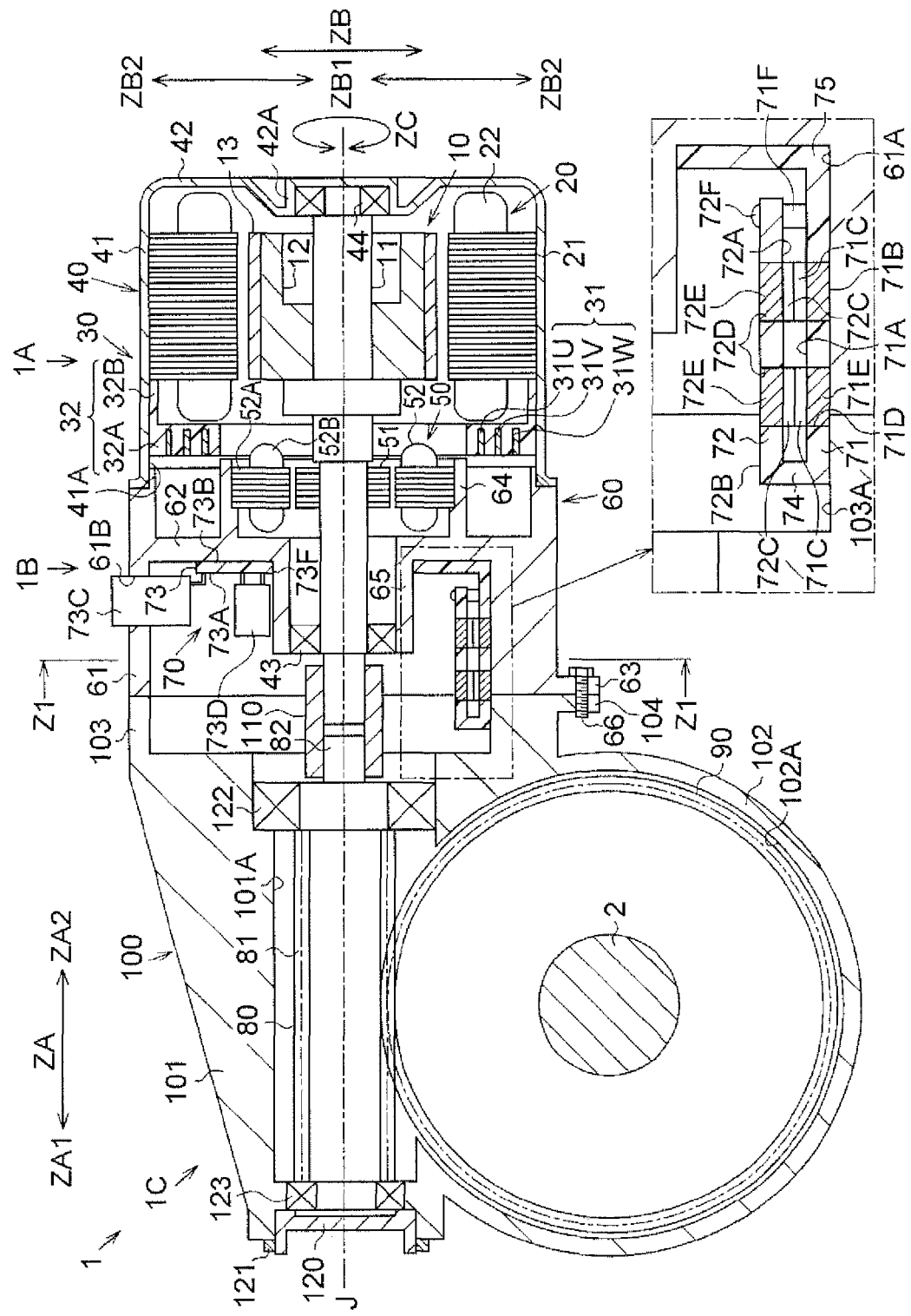
FIG. 1 is a sectional view of a motor unit according to a first embodiment of the present invention.

A structure of a motor unit 1 according to the present embodiment will be explained with reference to FIG. 1. The motor unit 1 includes an electric motor 1A, a control device 1B, and a speed reducer 1C. The motor unit 1 has a structure in which the control device 1B is located between the electric motor 1A and the speed reducer 1C.

The electric motor 1A has a rotor 10, a stator 20, a bus bar 30, a motor housing 40, bearings 43 and 44, and a resolver 50. The control device 1B has a housing 60 and a circuit board 70. The control device 1B controls operations of the electric motor 1A. The speed reducer 1C has a worm shaft 80, a worm wheel 90, and a gear housing 100. The speed reducer 1C transmits rotation of an output shaft 11 of the electric motor 1A to a steering shaft 2 in a state where speed of rotation of the output shaft 11 is reduced.

Directions of the motor unit 1 are defined as follows.

(A) A direction along a central axis (hereinafter, referred to as a "central axis J") of the rotor 10 is defined as an "axial direction ZA". A direction that is perpendicular to the axial direction ZA is defined as a "radial direction ZB". A rotating direction of the rotor 10 is defined as a "circumferential direction ZC".

(B) In the axial direction ZA, a direction that passes through the electric motor 1A, the control device 1B, and the speed reducer 1C in this order is defined as an "upper direction ZA1". Also, in the axial direction ZA, a direction that passes through the speed reducer 1C, the control device 1B, and the electric motor 1A in this order is defined as a "lower direction ZA2".

(C) In the radial direction ZB, a direction towards the central axis J is defined as an "inner direction ZB1". Also, in the radial direction ZB, a direction away from the central axis J is defined as an "outer direction ZB2".

The rotor 10 has the output shaft 11, a rotor core 12, and a permanent magnet 13. The rotor core 12 has a cylindrical shape. The rotor core 12 is press-fitted to the output shaft 11. The permanent magnet 13 is fixed to an outer periphery of the rotor core 12. The permanent magnet 13 has ten magnetic poles in the circumferential direction ZC.

The stator 20 includes a stator core 21, and a field portion 22. As an electric current is supplied to the stator 20 from a power source (not shown), the stator 20 forms a magnetic field that makes the rotor 10 rotate. Magnetic flux of the field portion 22 passes through the stator core 21. The stator core 21 is press-fitted to an inner periphery of a stator holding portion 41 of the motor housing 40. The field portion 22 forms concentrated winding as a conductive wire is wound around the stator core 21. The field portion 22 includes four U-phase coils, four V-phase coils, and four W-phase coils. As an electric current is supplied to the coils in each phase from the power source, magnetic fields are foamed around the coils in each phase.

The bus bar 30 has copper plates 31, and a supporting member 32. The bus bar 30 is mounted on the stator core 21 at a position offset from the stator core 21 in the upper direction ZA1. The bus bar 30 electrically connects the stator 20 with the circuit board 70.

Figure 2:
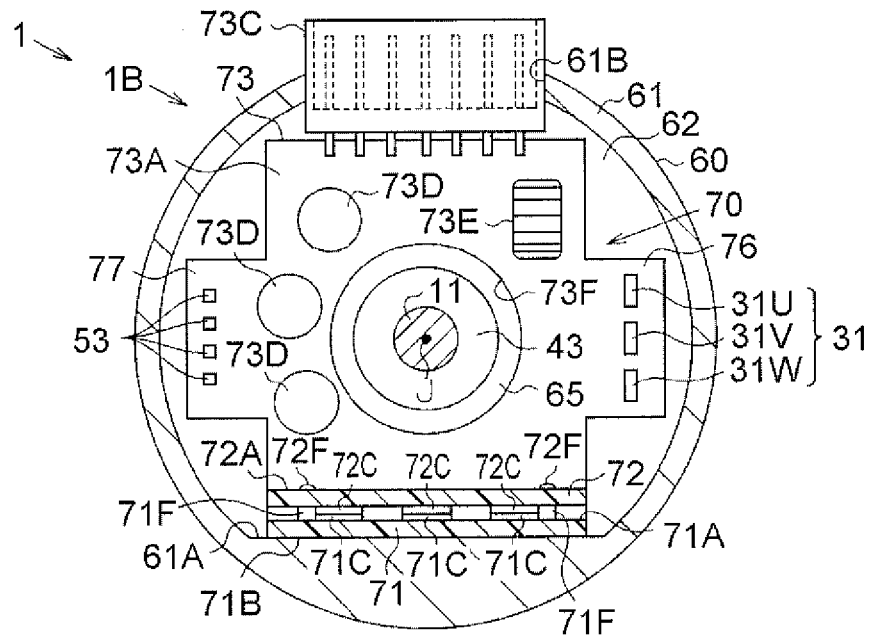
FIG. 2 is a sectional view taken along the line Z1-Z1 in FIG. 1.

The copper plates 31 include a U-phase copper plate 31U, a V-phase copper plate 31V, and a W-phase copper plate 31W. An end of each of the U-phase coils is connected with the U-phase copper plate 31U. An end of each of the V-phase coils is connected with the V-phase copper plate 31V. An end of each of the W-phase coils is connected with the W-phase copper plate 31W. Ends of the U-phase copper plate 31U, the V-phase copper plate 31V, the W-phase copper plate 31W extend in the upper direction ZA1, and are connected with the circuit board 70 (see FIG. 2).

The supporting member 32 includes a copper plate supporting portion 32A, and three leg portions 32B. The supporting member 32 has a structure in which the copper plate supporting portion 32A and the leg portions 32B are formed integrally from a same resin material. The copper plate supporting portion 32A has an annular shape. The copper plate supporting portion 32A supports the copper plates 31. The leg portions 32B extend in the lower direction ZA2 from an outer periphery portion of the copper plate supporting portion 32A. The leg portions 32B are separated from each other in the circumferential direction ZC. Lower end portions of the leg portions 32B are fitted to an outer periphery portion of the stator core 21.

The motor housing 40 has the stator holding portion 41 and a cover portion 42. The motor housing 40 has a structure in which the stator holding portion 41 and the cover portion 42 are formed integrally from a same metallic plate. The motor housing 40 houses a part of the rotor 10, the stator 20, and the bus bar 30.

The stator holding portion 41 has a cylindrical shape. The stator holding portion 41 has an opening portion 41A. The opening portion 41A opens in the upper direction ZA1 at an upper end portion of the stator holding portion 41. The cover portion 42 has a bearing supporting portion 42A. The cover portion 42 closes a lower end portion of the stator holding portion 41.

A bearing 43 is press-fitted to an upper end portion of the output shaft 11. The bearing 43 is fixed to a bearing supporting portion 65. A bearing 44 is press-fitted to a lower end portion of the output shaft 11. The bearing 44 is fixed to the bearing supporting portion 42A. The bearings 43 and 44 support the output shaft 11 so that the rotor 10 is able to rotate with respect to the stator 20.

The resolver 50 is located at a position offset from the bus bar 30 in the upper direction ZA1, and offset from the bus bar 30 in the inner direction ZB1. The resolver 50 outputs a voltage signal according to a rotational position of the rotor 10, to the circuit board 70. The resolver 50 has a resolver rotor 51, a resolver stator 52, and a circuit connecting member 53 (see FIG. 2). The resolver 50 has a structure of a variable reluctance resolver.

The resolver rotor 51 is press-fitted to the output shaft 11. The resolver stator 52 is fixed to a resolver supporting portion 64. The resolver stator 52 includes a resolver core 52A, and a resolver field portion 52B. The resolver core 52A is press-fitted to the resolver supporting portion 64. The resolver field portion 52B is formed by a conductive wire that is wound around the resolver core 52A. The circuit connecting member 53 includes a plurality of pin terminals. The circuit connecting member 53 extends in the upper direction ZA1. The circuit connecting member 53 electrically connects a coil end portion of the resolver field portion 52B with the circuit board 70 (see FIG. 2).

The housing 60 is fixed to an opening portion 41A of the motor housing 40. The housing 60 is located at a position offset from the bus bar 30 in the upper direction ZA1. The housing 60 includes a side wall 61, a cover portion 62, a fitting portion 63, the resolver supporting portion 64, and the bearing supporting portion 65. The housing 60 has a structure in which the side wall 61, the cover portion 62, the fitting portion 63, the resolver supporting portion 64, and the bearing supporting portion 65 are formed integrally from a same metallic material. The side wall 61 corresponds to "a supporting wall portion".

The side wall 61 has a cylindrical shape. The side wall 61 is fixed to the opening portion 41A of the motor housing 40. The side wall 61 includes a flat surface portion 61A (see FIG. 2), and a connector inserting portion 61B. The flat surface portion 61A and the connector inserting portion 61B face each other. The cover portion 62 is located in an intermediate portion of the side wall 61 in the axial direction ZA. The cover portion 62 closes the opening portion 41A. The cover portion 62 has a bus bar through hole and a resolver through hole (both of which are not shown). The fitting portion 63 is provided at an upper end portion of the side wall 61 to extend in the outer direction ZB2. The fitting portion 63 is fixed to a fitting portion 104 of the gear housing 100 by a bolt 66. The resolver supporting portion 64 has a cylindrical shape. The resolver supporting portion 64 extends in the lower direction ZA2 from the cover portion 62. The bearing supporting portion 65 has a cylindrical shape. The bearing supporting portion 65 is located at a position offset from the resolver supporting portion 64 in the inner direction ZB1. The bearing supporting portion 65 extends in the upper direction ZA1 from the cover portion 62. The bearing supporting portion 65 is inserted into an insertion hole 73F of the circuit board 70.

The circuit board 70 is fixed to an upper surface of the cover portion 62 of the housing 60. The circuit board 70 is formed as a multi-layer printed circuit board in which a plurality of thermoplastic resin films are stacked. The circuit board 70 has a through hole, and an interlayer connecting portion (not shown) that is made of a conductive paste filled in the through holes. The circuit board 70 is structured by performing a thermo compression bonding process on the stacked thermoplastic resin films in which conductor patterns and the conductive paste have been formed.

The worm shaft 80 rotates integrally with the output shaft 11. The worm shaft 80 has a gear portion 81, and a connecting portion 82. The gear portion 81 of the worm shaft 80 meshes with the worm wheel 90. The worm shaft 80 has a structure in which a connecting member 110 is fixed to the connecting portion 82. The worm shaft 80 is connected with the output shaft 11 by the connecting member 110.

The worm wheel 90 is fixed to a steering shaft 2. The worm wheel 90 transmits rotation of the worm shaft 80 to the steering shaft 2. The gear housing 100 houses the worm shaft 80 and the worm wheel 90. The gear housing 100 includes a shaft housing portion 101, a wheel housing portion 102, a side wall 103, and the fitting portion 104. The gear housing 100 has a structure in which the shaft housing portion 101, the wheel housing portion 102, the side wall 103, and the fitting portion 104 are integrally formed of a same metallic material. The gear housing 100 has a structure in which a cover member 120, a locknut 121, and bearings 122 and 123 are fitted to the shaft housing portion 101.

The shaft housing portion 101 has an internal space 101A. The internal space 101A is formed as a through hole that extends through the gear housing 100 along the central axis J. The shaft housing portion 101 houses the worm shaft 80 in the internal space 101A.

The wheel housing portion 102 has an internal space 102A. The wheel housing portion 102 houses the worm wheel 90, and a part of the steering shaft 2, in the internal space 102A.

The side wall 103 has a cylindrical shape. The side wall 103 is located in a lower end portion of the gear housing 100. The side wall 103 has a flat surface portion 103A. The flat surface portion 103A is located at a position that corresponds to the flat surface portion 61A in a state where the gear housing 100 is fitted to the housing 60.

The cover member 120 closes the shaft housing portion 101 at an upper end portion of the shaft housing portion 101. In an outer periphery of the cover member 120, an external thread (not shown) is provided, which meshes with an internal thread (not shown) that is formed in the gear housing 100. The locknut 121 meshes with the external thread of the cover member 120.

The bearing 122 is press-fitted to a lower end portion of the worm shaft 80. The bearing 122 is fixed to a lower end portion of the shaft housing portion 101. The bearing 122 supports the worm shaft 80 so that the worm shaft 80 is able to rotate with respect to the gear housing 100.

The bearing 123 is press-fitted to an upper end portion of the worm shaft 80. The bearing 123 is fixed to an upper end portion of the shaft housing portion 101. The bearing 123 supports the worm shaft 80 so that the worm shaft 80 is able to rotate with respect to the gear housing 100.

Figure 3:
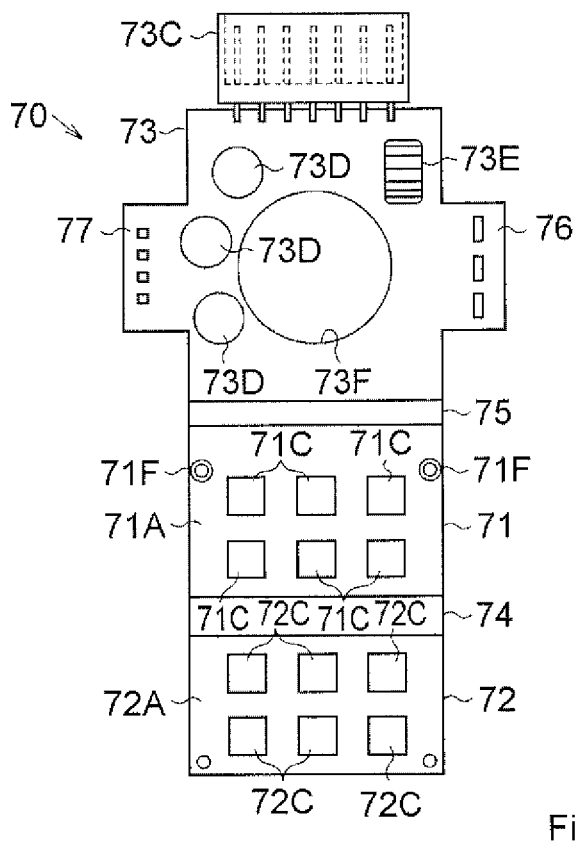
FIG. 3 is a development view showing a development structure of a circuit board according to the first embodiment.

A structure of the circuit board 70 will be explained with reference to FIG. 1 and FIG. 3. The circuit board 70 includes a first substrate portion 71, a second substrate portion 72, a third substrate portion 73, a first connecting portion 74, a second connecting portion 75, a bus bar connecting portion 76 (see FIG. 3), and a resolver connecting portion 77 (see FIG. 3). The circuit board 70 has a structure in which the first substrate portion 71, the second substrate portion 72, the third substrate portion 73, the first connecting portion 74, the second connecting portion 75, the bus bar connecting portion 76, and the resolver connecting portion 77 are integrally formed. The first connecting portion 74 corresponds to "a connecting portion".

The first substrate portion 71 has a planar shape that extends along the axial direction ZA. The first substrate portion 71 includes a first main surface 71A, a first back surface 71B, six heat dissipation components 71C, six through holes 71D, six conductive portions 71E, and two substrate supporting components 71F. The first back surface 71B of the first substrate portion 71 is fixed to the flat surface portion 61A. The first substrate portion 71 has a structure in which the substrate supporting components 71F are fitted to a lower end portion of the first main surface 71A. The first substrate portion 71 includes a part of a control circuit that controls switching of heating elements 72C of the second substrate portion 72.

The conductive portions 71E are formed by filling the through holes 71D with metallic conductive paste. The conductive portions 71E are located in areas that correspond to the heat dissipation components 71C in the first substrate portion 71.

The heat dissipation components 71C are formed of aluminum. In the first substrate portion 71, the heat dissipation components 71C are located on the first main surface 71A that faces the heating elements 72C. The heat dissipation components 71C are in contact with the heating elements 72C. The heat dissipation components 71C have a quadrangular shape in a planer view. Dimensions of sides of the heat dissipation components 71C are larger than dimensions of corresponding sides of the heating elements 72C.

The second substrate portion 72 faces the first substrate portion 71 across a space in the radial direction ZB. The second substrate portion 72 is in parallel to the first substrate portion 71. The second substrate portion 72 includes a second main surface 72A, a second back surface 72B, six field effect transistors serving as the heating elements 72C, through holes 72D, six conductive portions 72E, and bolts 72F. In the second substrate portion 72, a power circuit is structured by the six heating elements 72C.

The heating elements 72C are fitted onto the second main surface 72A. The heating elements 72C are in contact with conductive portions 72E. The conductive portions 72E are formed by filling the through holes 72D with metallic conductive paste. In the second substrate portion 72, the conductive portions 72E are located in areas that correspond to the heating elements 72C.

The third substrate portion 73 has a control circuit that controls switching of the heating elements 72C of the second substrate portion 72. A voltage signal based on an induced voltage of the resolver field portion 52B is input to the third substrate portion 73 through the resolver connecting portion 77.

The third substrate portion 73 has a flat plate shape that extends along the radial direction ZB. The third substrate portion 73 includes a third main surface 73A, a third back surface 73B, an external connector 73C, electrolytic capacitors 73D, a toroidal coil 73E (see FIG. 3), and the insertion hole 73F. The third substrate portion 73 has a structure in which the external connector 73C, the electrolytic capacitors 73D, and the toroidal coil 73E are fitted to the third main surface 73A. The third back surface 73B of the third substrate portion 73 is fixed to an upper surface of the cover portion 62.

The first connecting portion 74 connects an upper end portion of the first substrate portion 71 with an upper end portion of the second substrate portion 72. The first connecting portion 74 is folded. The second connecting portion 75 connects a lower end portion of the first substrate portion 71 with an outer end portion of the third substrate portion 73. The second connecting portion 75 is folded.

The bus bar connecting portion 76 is orthogonal to the third substrate portion 73 in a section of the motor unit 1 taken along the radial direction ZB. The bus bar connecting portion 76 is fixed to the upper surface of the cover portion 62. Ends of the copper plates 31 of the bus bar 30 are connected to the bus bar connecting portion 76.

The resolver connecting portion 77 is orthogonal to the third substrate portion 73 in the section of the motor unit 1 taken along the radial direction ZB. The resolver connecting portion 77 is located on the opposite side of the third substrate portion 73 from the bus bar connecting portion 76 in the section of the motor unit 1 taken along the radial direction ZB. The circuit connecting member 53 of the resolver 50 is connected to the resolver connecting portion 77.

Figure 4:
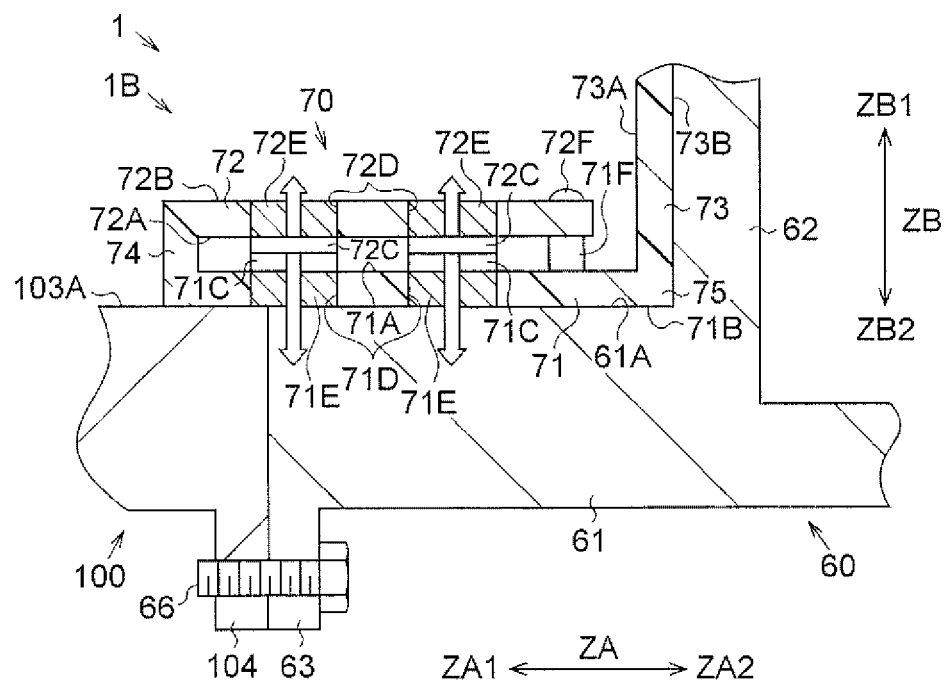
FIG. 4 is a sectional view showing a sectional structure of a first substrate portion and portions around the first substrate portion shown in FIG. 1.

Operations of the control device 1B will be explained with reference to FIG. 1 and FIG. 4. As shown in FIG. 1, in the control device 1B, the third substrate portion 73 is parallel to the radial direction ZB, the first substrate portion 71 is erected with respect to the third substrate portion 73, and the second substrate portion 72 is parallel to the axial direction ZA and faces the first substrate portion 71. Therefore, compared to a structure in which the first substrate portion 71, the second substrate portion 72, and the third substrate portion 73 are formed as a single circuit board having a flat plate shape and extending along the radial direction ZB, a dimension of the circuit board 70 in the radial direction ZB is able to be reduced. Since the first substrate portion 71 and the second substrate portion 72 face each other, a dimension of the circuit board 70 in the axial direction ZA is able to be reduced compared to a structure in which the first substrate portion 71 and the second substrate portion 72 are fainted as a single circuit board having a flat plate shape and extending along the axial direction ZA.

Heat dissipation of the heating elements 72C will be explained. When the motor unit 1 is driven, the heating elements 72C in the second substrate portion 72 generate heat. At this time, as shown in FIG. 4, heat of the heating elements 72C is transferred to the side wall 61 through the heat dissipation components 71C and the conductive portions 71E. Heat of the side wall 61 is then dissipated outside the motor unit 1. Therefore, heat is efficiently dissipated toward the side wall 61 from the heating elements 72C in the second substrate portion 72 that is located at a position separated from the housing 60.

Heat of the heating elements 72C is dissipated to an internal space of the housing 60 through the conductive portions 72E of the second substrate portion 72. Thus, the control device 1B has two heat dissipation paths for the heating elements 72C. Therefore, compared to a structure with one heat dissipation path, the heat dissipation performance of the heating elements 72C is higher.

The motor unit 1 according to the present embodiment provides the following effects.

(1) The control device 1B includes the circuit board 70 in which the heating elements 72C of the second substrate portion 72 are in contact with the heat dissipation components 71C of the first substrate portion 71. According to the structure, heat of the heating elements 72C is transferred to the second substrate portion 72 and to the heat dissipation components 71C. Therefore, compared to a structure without the heat dissipation components 71C, the heat dissipation performance of the heating elements 72C is higher.

(2) The circuit board 70 has the conductive portions 71E that are in contact with the heat dissipation components 71C. According to this structure, heat of the heat dissipation components 71C is transferred to the conductive portions 71E. Therefore, an amount of heat transferred from the heating elements 72C to the heat dissipation components 71C is increased. Thus, a temperature increase of the heating elements 72C is suppressed more effectively.

(3) The control device 1B has the circuit board 70 in which the first substrate portion 71 is erected with respect to the third substrate portion 73. According to the structure, the dimension of the circuit board 70 in the radial direction ZB is able to be reduced compared to the structure in which the first substrate portion 71 and the third substrate portion 73 are formed as a single circuit board having a flat plate shape. Therefore, a dimension of the control device 1B in the radial direction ZB is able to be reduced.

(4) The control device 1B has the circuit board 70 in which the second substrate portion 72 faces and is parallel to the first substrate portion 71. According to the structure, the dimension of the circuit board 70 in the axial direction ZA is able to be reduced compared to the structure in which the first substrate portion 71 and the second substrate portion 72 are formed as a single circuit board having a flat plate shape and extending along the axial direction ZA. Therefore, a dimension of the control device 1B in the axial direction ZA is able to be reduced.

(5) The control device 1B has the circuit board 70 in which the heating elements 72C are fitted to the second substrate portion 72 that faces the side wall 61 across a space. The heating elements 72C are in contact with the heat dissipation components 71C. The heat dissipation components 71C are in contact with the conductive portions 71E. The conductive portions 71E are in contact with the side wall 61 of the housing 60. According to the structure, it is possible to transfer heat from the heating elements 72C to the housing 60 even in the circuit board 70 in which the heating elements 72C are fitted to the second substrate portion 72 that is separated from the side wall 61 via a space. Therefore, even in the structure in which the heating elements 72C are fitted to the second substrate portion 72, the heating elements 72C have high heat dissipation performance. Hence, degree of freedom in layout of the heating elements 72C in the circuit board 70 is improved.

(6) The circuit board 70 has the conductive portions 72E that are in contact with the heating elements 72C. According to the structure, heat of the heating elements 72C is transferred to the conductive portions 72E. Therefore, an amount of heat transferred from the heating elements 72C to the second substrate portion 72 is increased. Thus, a temperature increase of the heating elements 72C is suppressed more effectively.

(7) The control device 1B has the housing 60 in which a dimension of the flat surface portion 61A in the radial direction ZB is larger than a dimension of the other part of the side wall 61 in the radial direction ZB. According to the structure, heat of the heating elements 72C is transferred to the side wall 61 that has the flat surface portion 61A, via the heat dissipation components 71C and the conductive portions 71E. Therefore, compared to a structure in which heat of the heating elements 72C is transferred to the other part of the side wall 61, an amount of heat transferred from the heating elements 72C to the housing 60 is increased. This makes it possible to suppress a temperature increase of the heating elements 72C.

Figure 5:
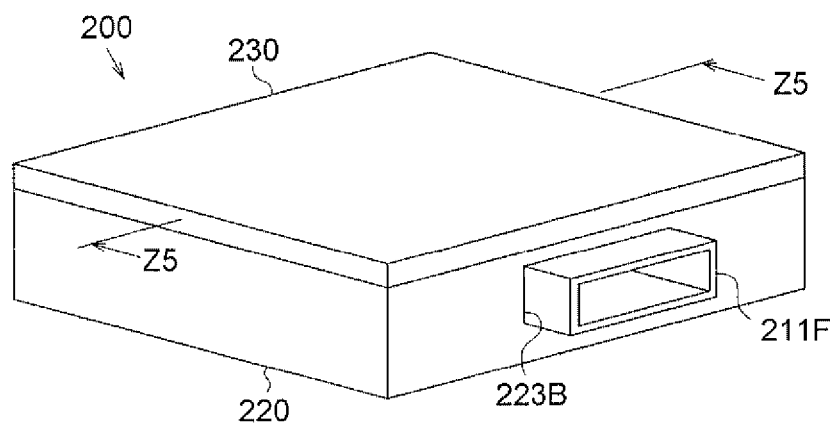
FIG. 5 is a perspective view showing a perspective structure of a control device according to a second embodiment of the present invention.
Figure 6:
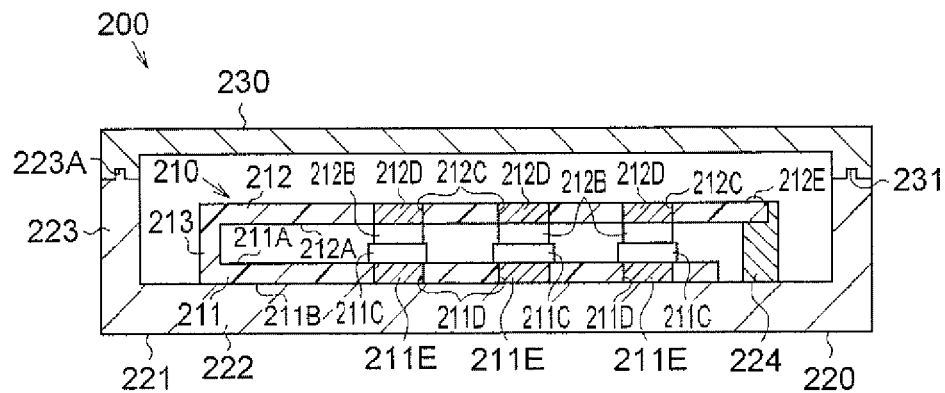
FIG. 6 is a sectional view taken along the line Z5-Z5 in FIG. 5.

FIG. 5 and FIG. 6 show a structure of a control device 200 according to a second embodiment. The control device 200 according to the present embodiment is different from the control device 1B (see FIG. 1) of the first embodiment in that the control device 200 is formed separately from the electric motor 1A (see FIG. 1). In the explanation below, constituents of the second embodiment, which are explained as constituents that correspond to the constituents of the first embodiment, have the same or similar functions as those of the corresponding constituents of the first embodiment.

As shown in FIG. 6, the control device 200 includes a circuit board 210, a housing 220, and a cover 230. The housing 220 is formed from a metallic material. The housing 220 has a box shape that is rectangular in a planar view (see FIG. 5). The housing 220 houses the circuit board 210. The housing 220 includes a housing body 221, and substrate supporting components 224. The housing 220 has a structure in which the housing body 221, and the two substrate supporting components 224 are formed separately from each other.

The housing body 221 includes a bottom wall 222, and a side wall 223. The housing body 221 has a structure in which the bottom wall 222 and the side wall 223 are formed integrally from a same metallic material. The side wall 223 has a fitting projection 223A, and a connector inserting portion 223B (see FIG. 5). The fitting projection 223A projects from an end surface of the side wall 223. The connector inserting portion 223B is formed as a through hole that extends through the side wall 223 in a thickness direction of the side wall 223. The bottom wall 222 corresponds to "a supporting wall portion".

The cover 230 covers the side wall 223 of the housing 220 from the side opposite to the bottom wall 222. The cover 230 is fixed to the side wall 223 by a bolt (not shown). The cover 230 has a fitting recessed portion 231. The fitting recessed portion 231 is fitted to the fitting projection 223A.

The circuit board 210 corresponds to a structure in which the third substrate portion 73, the second connecting portion 75, the bus bar connecting portion 76, and the resolver connecting portion 77 are omitted from the circuit board 70 of the first embodiment. The circuit board 210 includes a first substrate portion 211 that corresponds to the first substrate portion 71 of the first embodiment, a second substrate portion 212 that corresponds to the second substrate portion 72 of the first embodiment, and a connecting portion 213 that corresponds to the first connecting portion 74 of the first embodiment.

The first substrate portion 211 includes a first main surface 211A, a first back surface 211B, six heat dissipation components 211C that correspond to the heat dissipation components 71C of the first embodiment, through holes 211D that correspond to the through holes 71D of the first embodiment, six conductive portions 211E that correspond to the conductive portions 71E of the first embodiment, and one external connector 211F (see FIG. 5). The first substrate portion 211 has a control circuit that corresponds to the control circuit of the first substrate portion 71 of the first embodiment. The first substrate portion 211 has a structure in which the heat dissipation components 211C and the external connector 211F are fitted to the first main surface 211A. The first back surface 211B of the first substrate portion 211 is fixed to the bottom wall 222. The external connector 211F projects outside the housing 220 through the connector inserting portion 223B.

The second substrate portion 212 faces the first substrate portion 211 across a space. The second substrate portion 212 is parallel to the first substrate portion 211. The second substrate portion 212 includes a second main surface 212A, six field effect transistors serving as heating elements 212B that correspond to the heating elements 72C of the first embodiment, through holes 212C that correspond to the through holes 72D of the first embodiment, six conductive portions 212D that correspond to the conductive portions 72E of the first embodiment, and bolts 212E. The second substrate portion 212 has a power circuit that corresponds to the power circuit of the second substrate portion 72 of the first embodiment. The second main surface 212A of the second substrate portion 212 faces the first main surface 211A of the first substrate portion 211. The second main surface 212A of the second substrate portion 212 is in contact with the substrate supporting components 224. The second substrate portion 212 is fixed to the substrate supporting components 224 by the bolts 212E. The heating elements 212B are fitted onto the second main surface 212A. The heating elements 212B are in contact with the conductive portions 212D and the heat dissipation components 211C.

The connecting portion 213 connects one end portion of the first substrate portion 211 with one end portion of the second substrate portion 212. The connecting portion 213 is folded. Operations of the control device 200 are the same as the operations of the control device 1B, and thus, explanation of the operations of the control device 200 is omitted. The control device 200 of the present embodiment provides the same effects as the effects (1) to (7) of the motor unit 1 of the first embodiment.

Modified embodiments of the first and second embodiments will be described below as other embodiments of the present invention. The modified embodiments explained below may be combined with each other.

Figure 7:
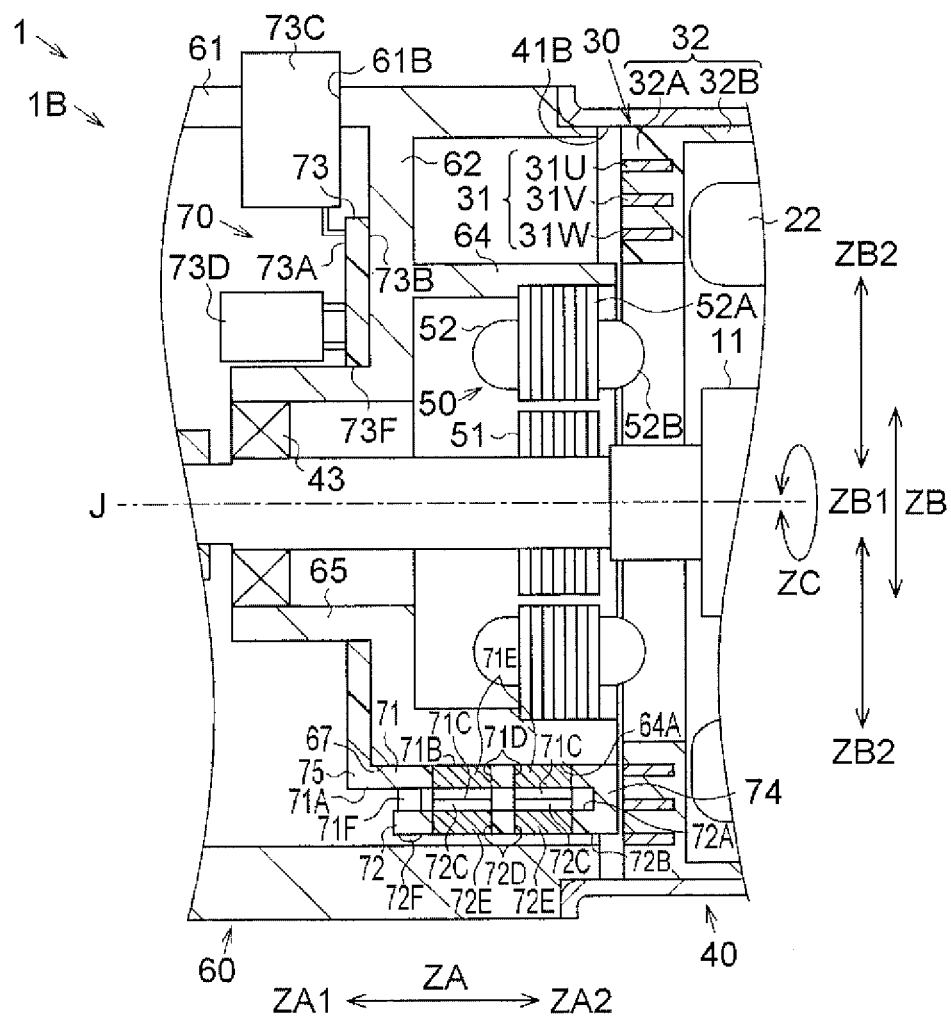
FIG. 7 is a sectional view of a motor unit according to another embodiment of the present invention.

In the control device 1B according to the first embodiment, the circuit board 70 has the structure in which the first substrate portion 71 and the second substrate portion 72 extend in the upper direction ZA1 with respect to the third substrate portion 73. Meanwhile, as shown in FIG. 7, the control device 1B of a modified embodiment has a structure in which the first substrate portion 71 and the second substrate portion 72 extend in the lower direction ZA2 with respect to the third substrate portion 73. The resolver supporting portion 64 of the housing 60 of the modified embodiment includes a flat surface portion 64A in an area that corresponds to the first substrate portion 71. The housing 60 of the modified embodiment also includes a substrate inserting portion 67 into which the first substrate portion 71 and the second substrate portion 72 are inserted. The substrate inserting portion 67 extends through an outer periphery portion of the cover portion 62 in the axial direction ZA. The first back surface 71B of the first substrate portion 71 is fixed to the flat surface portion 64A. The motor unit 1 of the modified embodiment has a structure in which the first substrate portion 71 and the second substrate portion 72 overlap with the resolver 50 in the axial direction ZA. According to this structure, a dimension of the motor unit 1 in the axial direction ZA is able to be reduced compared to the motor unit 1 of the first embodiment.

The control device 1B according to the first embodiment has the circuit board 70 in which the same number of thermoplastic resin films are stacked in the first substrate portion 71, the second substrate portion 72, and the first connecting portion 74. Meanwhile, the control device 1B of a modified embodiment has the circuit board 70 in which the number of thermoplastic resin films stacked in the first connecting portion 74 is smaller than the number of thermoplastic resin films stacked in each of the first substrate portion 71 and the second substrate portion 72. The same modification may be made in the control device 200 of the second embodiment.

The control device 1B according to the first embodiment includes the circuit board 70 that is formed as a multi-layer printed circuit board in which the plurality of thermoplastic resin films are stacked. Meanwhile, the control device 1B of a modified embodiment has the circuit board 70 in which the first substrate portion 71 and the second substrate portion 72 are formed as printed circuit boards made of a thermosetting resin that serves as a base material, and a first connecting portion 74 is formed as a flexible printed wiring board. The same modification may be made in the control device 200 of the second embodiment.

The control device 1B according to the first embodiment includes the circuit board 70 that has the third substrate portion 73, the bus bar connecting portion 76, and the resolver connecting portion 77. Meanwhile, the control device 1B of a modified embodiment includes the circuit board 70 in which the third substrate portion 73, the bus bar connecting portion 76, and the resolver connecting portion 77 are omitted.

The control device 1B according to the first embodiment has the structure in which the heat dissipation components 71C are in contact with the heating elements 72C. Meanwhile, the control device 1B of a modified embodiment has a structure in which the heat dissipation components 71C are separated from the heating elements 72C with a given distance. The given distance is equal to or smaller than a height dimension of the heating elements 72C from the first main surface 71A. In other words, the structure of the control device 1B is not limited to the structure in which the heat dissipation components 71C are in contact with the heating elements 72C, and the heat dissipation components 71C may be located away from the heating elements 72C with a gap therebetween to an extent that secures cooling performance required for the heating elements 72C. Here, the structure in which "the heat dissipation components and the heating elements face each other" includes a structure in which the heat dissipation components and the heating elements face each other so as to be in contact with each other, and the structure in which the heating elements and the heat dissipation components face each other across a gap to an extent that secures cooling performance required for the heating elements. The same modification may be made in the control device 200 of the second embodiment.

Figure 8:
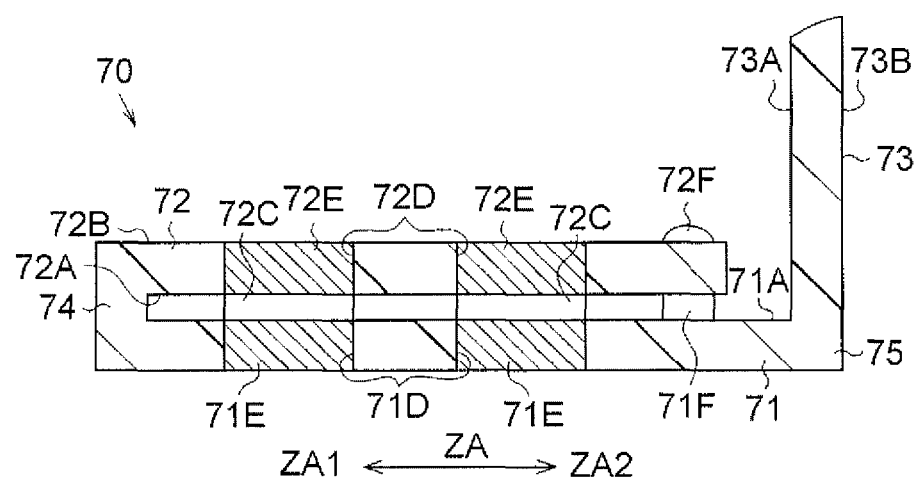
FIG. 8 is a sectional view showing a part of a sectional structure of a circuit board according to another embodiment of the present invention.

The control device 1B according to the first embodiment includes the circuit board 70 that has the heat dissipation components 71C and the conductive portions 72E. Meanwhile, as shown in FIG. 8, the control device 1B of a modified embodiment has the circuit board 70 in which the heat dissipation components 71C are omitted. The control device 1B of the modified embodiment has a structure in which conductive portions 71E are in contact with heating elements 72C. According to this structure, a gap between the first main surface 71A and the second main surface 72A is able to be reduced compared to the structure in which the heat dissipation components 71C are fitted onto the first main surface 71A. The through holes 71D and the conductive portions 71E correspond to "heat dissipation components". The control device 1B of another modified embodiment has a structure in which heat dissipation components are additionally provided on the second back surface 72B of the second substrate portion 72. On the second back surface 72B, the heat dissipation components are located in areas that correspond to the conductive portions 72E. The same modification may be made in the control device 200 of the second embodiment.

The control device 1B according to the first embodiment includes the circuit board 70 that has the structure in which the through holes 71D are filled with the conductive portions 71E, and the heat dissipation components 71C are in contact with the conductive portions 71E. Meanwhile, the control device 1B of a modified embodiment includes the circuit board 70 that has a structure in which the through holes 71D are filled with the heat dissipation components 71C, and the conductive portions 71E are in contact with the heat dissipation components 71C. According to this structure, heat of the heating element 72C is transferred to the heat dissipation components 71C through the conductive portions 71E. Therefore, an amount of heat that is transferred from the heating elements 72C to the heat dissipation components 71C is increased. Hence, a temperature increase in the heating elements 72C is suppressed more effectively. The same modification may be made in the control device 200 of the second embodiment.

The control device 1B according to the first embodiment includes the circuit board 70 that has the conductive portions 71E and the conductive portions 72E. Meanwhile, the control device 1B of a modified embodiment includes the circuit board 70 in which at least either the conductive portions 71E or the conductive portions 72E are omitted. The same modification may be made in the control device 200 of the second embodiment.

The control device 1B according to the first embodiment includes the circuit board 70 in which the heat dissipation components 71C having a quadrangular shape in a planer view are provided. Meanwhile, the control device 1B of a modified embodiment includes the circuit board 70 in which the heat dissipation components 71C having a circular shape in a planar view are provided. In other words, the shape of the heat dissipation components 71C is not limited to the quadrangular shape as long as the heat dissipation components 71C are able to play a role in transferring heat of the heating elements 72C. The same modification may be made in the control device 200 of the second embodiment.

The control device 1B of the first embodiment includes the circuit board 70 in which the heat dissipation components 71C formed of aluminum are provided. Meanwhile, the control device 1B of a modified embodiment includes the circuit board 70 in which the heat dissipation components 71C formed of a metallic material other than aluminum are provided. The same modification may be made in the control device 200 of the second embodiment.

The control device 1B according to the first embodiment includes the circuit board 70 in which the heat dissipation components 71C are fitted onto the first substrate portion 71, and the heating elements 72C are fitted onto the second substrate portion 72. Meanwhile, the control device 1B of a modified embodiment includes the circuit board 70 in which the heating elements 72C are fitted onto the first substrate portion 71, and the heat dissipation components 71C are fitted onto the second substrate portion 72. The same modification may be made in the control device 200 of the second embodiment.

The control device 1B according to the first embodiment includes the circuit board 70 in which the six heat dissipation components 71C are provided at positions that correspond to the six heating elements 72C. Meanwhile, the control device 1B of a modified embodiment includes the circuit board 70 in which one heat dissipation component 71C, which faces all of the six heating elements 72C, is provided. The same modification may be made in the control device 200 of the second embodiment.

In the control device 1B of the first embodiment, field effect transistors are used as the heating elements 72C. Meanwhile, in the control device 1B of a modified embodiment, resistors are used as the heating elements 72C. In other words, circuit elements, which generate heat when the control device 1B operates, are used as the heating element 72C. The same modification may be made in the control device 200 of the second embodiment.

Figure 9:
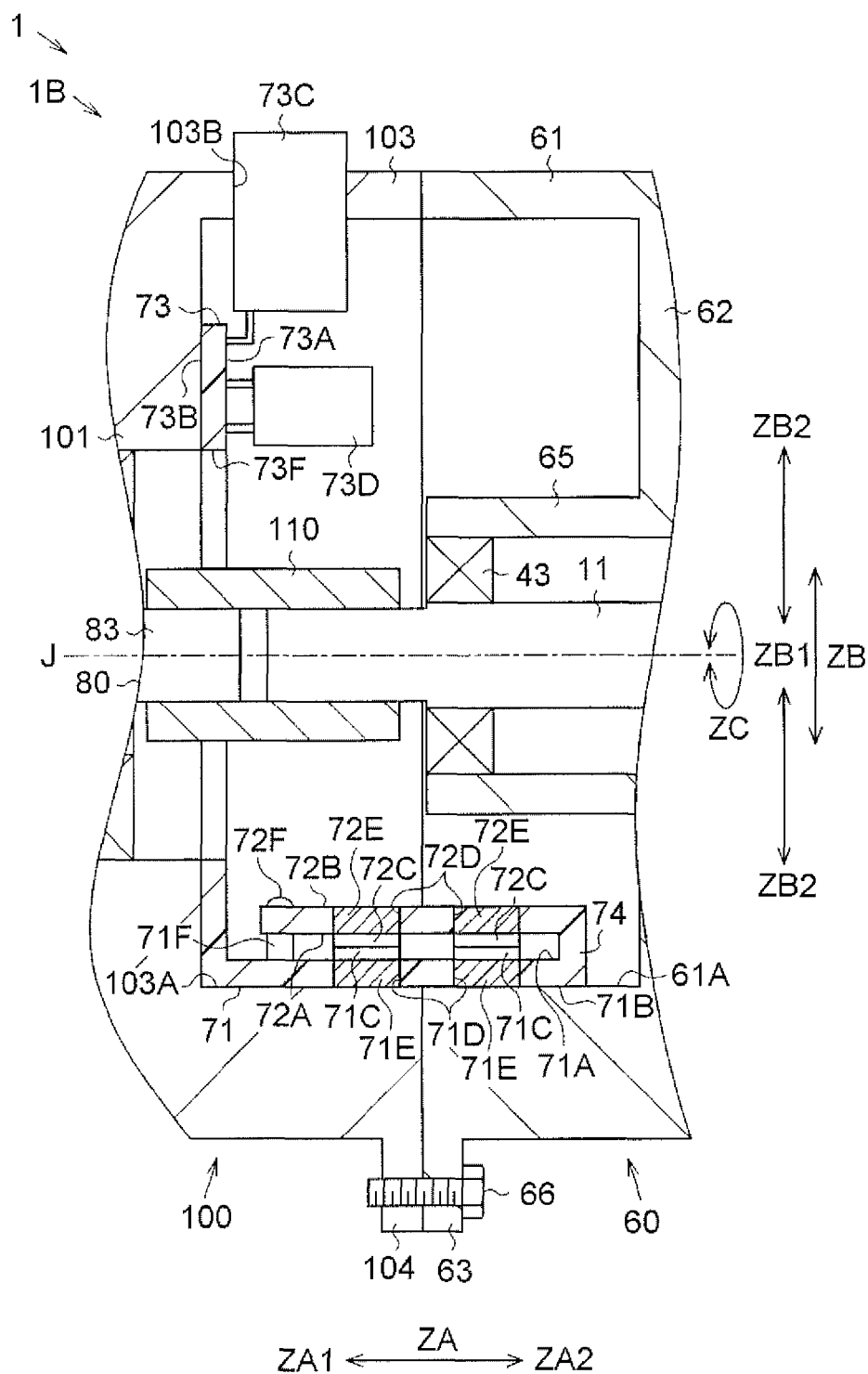
FIG. 9 is a sectional view of a motor unit according to another embodiment of the present invention.
Figure 10:
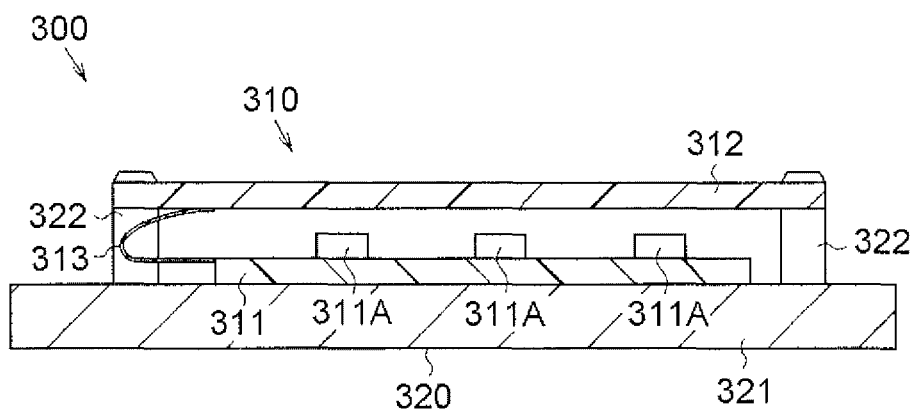
FIG. 10 is a sectional view showing a sectional structure of a conventional control device.

The control device 1B according to the first embodiment has the structure in which the circuit board 70 is fixed to the side wall 61 and the cover portion 62 of the housing 60. Meanwhile, as shown in FIG. 9, the control device 1B of a modified embodiment has a structure in which the circuit board 70 is fixed to the gear housing 100. The first substrate portion 71 is fixed to the side wall 103 of the gear housing 100. The third substrate portion 73 is fixed to a lower end surface of the shaft housing portion 101. The housing 60 has a structure in which the connector inserting portion 61B is omitted from the side wall 61. The gear housing 100 has a connector inserting portion 103B. An external connector 73C is inserted to the connector inserting portion 103B. The gear housing 100 corresponds to "a housing". The shaft housing portion 101 corresponds to "a supporting wall portion".

The motor unit 1 having the control device 1B of the foregoing modified embodiment has the structure in which the gear housing 100 is fixed to the housing 60. Meanwhile, the motor unit 1 of another modified embodiment has a structure in which the gear housing 100 is fixed to the motor housing 40. In other words, the motor unit 1 of the other modified embodiment does not include the housing 60. The motor unit 1 of the other modified embodiment has a structure as a sensorless motor instead of the structure including the resolver 50. Also, the motor unit 1 of the other modified embodiment does not have the bearing 43. According to this structure, the dimension of the motor unit 1 in the axial direction ZA is able to be reduced. Also, it is possible to reduce the number of components that constitute the motor unit 1.

The control device 1B according to the first embodiment has the structure in which the first substrate portion 71 of the circuit board 70 is fixed to the side wall 61 of the housing 60. Meanwhile, the control device 1B of a modified embodiment has a structure in which a ceramic substrate having a flat plate shape (not shown) is fixed to the first back surface 71B of the first substrate portion 71, and the ceramic substrate is fixed to the side wall 61.

The electric motor 1A according to the first embodiment has the resolver 50 as a rotational position detector. Meanwhile, the electric motor 1A according to a modified embodiment has a Hall IC instead of the resolver 50, as a rotational position detector. The electric motor 1A of another modified example has a structure as a sensorless motor, in which the rotational position detector is omitted. The electric motor 1A of another modified embodiment has a structure in which the resolver supporting portion 64 is omitted from the housing 60, and the resolver connecting portion 77 is omitted from the circuit board 70.

What is claimed is:

1. A control device including a circuit board and a housing, wherein
    the housing has a supporting wall portion that supports the circuit board, and
    the circuit board includes:
        a first substrate portion that is arranged on the supporting wall portion, has a first main surface, and has one of a heating element and a heat dissipation component;
        a second substrate portion that has a second main surface facing the first main surface of the first substrate portion, and has the other one of the heating element and the heat dissipation component, the heat dissipation component and the heating element facing each other; and
    a connecting portion that connects an end portion of the first substrate portion with an end portion of the second substrate portion.

2. The control device according to claim 1, wherein the control device includes a multi-layer printed circuit board made of thermoplastic resin films as the circuit board, and
    each of the first substrate portion, the second substrate portion, and the connecting portion in the circuit board is formed of the thermoplastic resin films.

3. The control device according to claim 2, wherein
    one of the first substrate portion and the second substrate portion has the heat dissipation component, a through hole, and a conductive portion,
    the through hole is filled with the conductive portion, and
    the heat dissipation component is located between the heating element and the conductive portion, and is in contact with the conductive portion.

4. The control device according to claim 2, wherein the heat dissipation component is formed of a through hole and a conductive portion with which the through hole is filled.

5. The control device according to claim 2, wherein one of the first substrate portion and the second substrate portion has the heat dissipation component, a through hole, and a conductive portion,
    the through hole is filled with the heat dissipation component, and
    the conductive portion is located between the heating element and the heat dissipation component, and is in contact with the heat dissipation component.

6. A motor unit comprising the control device according to claim 1.

* * * * *